United States Patent [19]
Ferris

[11] Patent Number: 5,642,313
[45] Date of Patent: Jun. 24, 1997

[54] VOLTAGE BOOSTER CIRCUIT FOR A MEMORY DEVICE

[75] Inventor: Andrew Ferris, Milan, Italy

[73] Assignee: SGS-Thomson Microelectronics Limited, Almondsbury, United Kingdom

[21] Appl. No.: 558,326

[22] Filed: Nov. 15, 1995

[30] Foreign Application Priority Data

Nov. 15, 1994 [GB] United Kingdom .................. 9423035

[51] Int. Cl.$^6$ .................................................. G11C 7/00
[52] U.S. Cl. .................... 365/185.25; 365/226; 365/204; 326/88
[58] Field of Search .................... 365/185.25, 185.23, 365/189.11, 203, 204, 226; 326/80, 88, 92; 327/536, 540, 589

[56] References Cited

U.S. PATENT DOCUMENTS

| | | | |
|---|---|---|---|
| 4,639,622 | 1/1987 | Goodwin | 307/482 |
| 4,704,706 | 11/1987 | Nakano et al. | 365/203 |
| 4,707,625 | 11/1987 | Yanagisawa | 365/203 |
| 4,896,297 | 1/1990 | Miyatake et al. | 365/189.1 |
| 4,916,334 | 4/1990 | Minagawa et al. | 307/296.5 |
| 5,056,062 | 10/1991 | Kuwabara et al. | 365/185.23 |
| 5,222,042 | 6/1993 | Ichiguchi | 365/203 |
| 5,258,955 | 11/1993 | Gaultier | 365/203 |
| 5,293,342 | 3/1994 | Casper et al. | 365/203 |
| 5,333,122 | 7/1994 | Ninomiya | 365/185.23 |
| 5,373,479 | 12/1994 | Noda | 365/203 |

FOREIGN PATENT DOCUMENTS

| | | |
|---|---|---|
| 0367450 | 5/1990 | European Pat. Off. . |
| 0505158 | 9/1992 | European Pat. Off. . |
| 0585150 | 3/1994 | European Pat. Off. . |

*Primary Examiner*—Tan T. Nguyen
*Attorney, Agent, or Firm*—Wolf, Greenfield & Sacks, P.C.; James H. Morris

[57] ABSTRACT

A voltage boost circuit is provided which supplies a gate voltage to an insulated gate transistor. The voltage boost circuit has a voltage supply circuit, a supply line for connection to the gate of the insulated gate transistor and connected to the voltage supply circuit for precharge, a boost precharge circuit connected to the supply line and a capacitive element for boosting the voltage on the supply line. The circuit also has a facility for resetting the voltage on the supply line to its initial value after operation of the boost circuit.

A memory array including such a voltage boost circuit is also provided, together with a method of boosting a gate voltage for insulating gate transistors in a memory array.

29 Claims, 8 Drawing Sheets

FIG. 3

| | SELECTED CELL | | | UNSELECTED CELL SAME ROW | | | UNSELECTED CELL SAME COLUMN | | |
|---|---|---|---|---|---|---|---|---|---|
| | DRAIN VOLTAGE | GATE VOLTAGE | SOURCE VOLTAGE | DRAIN VOLTAGE | GATE VOLTAGE | SOURCE VOLTAGE | DRAIN VOLTAGE | GATE VOLTAGE | SOURCE VOLTAGE |
| PROGRAM | ~5V | $V_{PP}$ | $V_{GND}$ | $V_{GND}$ | $V_{PP}$ | $V_{GND}$ | ~5V | $V_{GND}$ | $V_{GND}$ |
| ERASE* | FLOATING | $V_{GND}$ | $V_{PP}$ | FLOATING | $V_{GND}$ | $V_{PP}$ | FLOATING | $V_{GND}$ | $V_{PP}$ |
| READ | BIASED TO ~1V | ~5V | $V_{GND}$ | $V_{GND}$ | ~5V | $V_{GND}$ | BIASED TO ~1V | $V_{GND}$ | $V_{GND}$ |

* ALL CELLS SELECTED IN ERASE

VOLTAGE BOOSTER CIRCUIT FOR A MEMORY DEVICE

FIELD OF THE INVENTION

This invention relates to an integrated circuit device, and in particular to improved circuitry for boosting a signal level within an integrated circuit device above the level of the voltage supply.

BACKGROUND TO THE INVENTION

The invention is particularly, but not exclusively, concerned with a memory device in which memory cells are formed by insulated gate transistors. These memories include EPROMS and FLASH EPROMS referred to herein as flash memories.

Flash memories having low voltage supplies of 3.3V±0.3V introduce biasing problems in reading erased cells. In a large memory array the threshold voltages of erased cells (ie the gate voltage required to turn the transistor in the cell on when the source is grounded) vary over a distributed range having a maximum and a minimum. During a read operation erased cells in a memory array are required to sink current from their associated bit line when selected by turning on, whilst programmed cells are required to sink substantially no current when selected by remaining turned off.

The value of the average of the threshold voltage distribution is determined by how low the minimum can be allowed to be. If a cell is over-erased, its threshold voltage may become negative such that the cell is always turned on and sinking current from its associated bit line. In such an event all the cells associated with that same bit line will become unusable because of the over-erased cell continually sinking current, since every cell will then appear to be erased when read even if programmed. The threshold voltage distribution is therefore determined such that the minimum will never become a negative value, and in practice this results in the maximum of the threshold voltage distribution being approximately 3V.

In devices having a supply voltage of 5V±10% it is ensured that applying the supply voltage via a wordline to the transistor gate of an erased cell having a threshold voltage of 3V will cause the cell to turn on and sink current. However, in devices having supply voltages of 3.3V±0.3V it cannot be ensured that there will be sufficient voltage supplied to the transistor gate of an erased cell having a threshold voltage of 3V to turn such cell on to the extent that an adequate current for sensing flows. An adequate current for sensing may be 50 A, and erased cell currents are typically 100 A. In order to ensure an adequate current for sensing it is necessary to supply a voltage via the wordline to the transistor gate of an erased cell of at least 4V when the threshold voltage of such a cell is approximately 3V. Therefore when using a memory device having a low voltage supply, some means of raising the supply voltage applied to the wordline during a read operation is required.

It is unnecessary, during a read operation, to raise the supply voltage applied to the wordline to a level such that a programmed cell is turned on. Programmed cells generally do not switch on during read operations because the threshold voltages of their associated transistors is high, typically greater than 5V.

There are two commonly known ways for raising the voltage on the wordline above the supply voltage Vcc. The first known method is a charge pump which comprises a circuit with several stages, each stage providing a charge transfer using a clock, a diode and a capacitor to raise the potential of its stage outputs. Each stage raises the potential above the output of the previous stage so that the difference between the actual supply voltage of the device and the output of the charge pump can be several volts. Such a scheme provides a constantly high level for the wordline supply.

The second known method is the single-shot boost scheme. In such a scheme the voltage supply is boosted using a single capacitor to transfer an amount of charge sufficient to provide the required voltage to the wordline. With this scheme the wordline voltage need only be raised until the sensing operation is complete. After sensing, the signal level of the wordline can be returned to the level of the supply.

When used in an asynchronous environment, both schemes have particular design requirements. The charge-pump scheme requires a clock that runs continuously to keep the output of the charge pump at the required voltage level. The output of the charge pump will have a voltage ripple due to leakage and therefore the value of the output of the charge pump cannot be accurately defined. In addition, when many addresses are continually changing in an asynchronous environment it is possible that the output level of the charge pump may be 'walked down', ie fall in response to each change in address. Furthermore the requirement for the clock to continually run consumes a considerable amount of power, which is a severe restraint in applications where an extremely low power requirement is essential, for example in laptop computer applications and especially in standby mode.

With the single shot boost scheme it is important to have a well defined level on the wordline during the time that the cell is accessed. In the case of asynchronous operation, where the addresses may transition at any time, it is desirable to boost the supply above the supply voltage only once the addresses have become stable. The single shot boost scheme does not suffer from the above power consumption problems since the supply need only be boosted when needed by being triggered by an address transistion detection pulse and is in a quiescent state when the chip is disabled.

SUMMARY OF THE INVENTION

According to one aspect of the present invention there is provided a voltage boost circuit for supplying a gate voltage to an insulated gate transistor, said circuit comprising: a voltage supply circuit of a first voltage; a supply line for connection to the gate of the insulated gate transistor and connected to said voltage supply circuit for precharge to the first voltage by said voltage supply circuit; boost circuitry including a boost precharge circuit connected to said supply line for precharging said supply line to the first voltage, and a capacitive element connected to said supply line to boost the voltage on said supply line to a second voltage higher than said first voltage after precharge; reset circuitry for resetting the voltage on said supply line to said first voltage after operation of said boost circuitry; and control circuitry for controlling operation of said reset circuitry and said boost circuitry.

The voltage supply circuit and the boost precharge circuit may be connected to precharge the supply line together in effecting a voltage boost operation.

One of the voltage supply circuit and the boost precharge circuit may connect the supply line to the first voltage through a conductive path of an n-type switch circuit, and the other through a conductive path of a p-type switch circuit.

According to a second aspect of the present invention there is provided a memory comprising an array of insulated gate transistors, including a voltage boost circuit for supplying a gate voltage to said transistors, said boost circuit comprising: a voltage supply circuit of a first voltage; a supply line for connection to the gates of the plurality of insulated gate transistors and connected to said voltage supply circuit for precharge to the first voltage by said voltage supply circuit; boost circuitry including a boost precharge circuit connected to said supply line for precharging said supply line to the first voltage, and a capacitive element connected to said supply line to boost the voltage on said supply line to a second voltage higher than said first voltage after precharge; reset circuitry for resetting the voltage on said supply line to said first voltage after operation of said boost circuitry; and control circuitry for controlling operation of said reset circuitry and said boost circuitry.

The memory array may further comprise bit lines, a sense amplifier having first and second input terminals for connection respectively to a selected bit line and a reference signal and first and second outputs, said sense amplifier also including latch circuitry for providing stable logic states for said outputs in dependence on the state of the differential between a signal on said selected bit line and said reference signal; and detection circuitry responsive to said first and second outputs to control the reset circuitry to reset the voltage on the supply line.

The voltage supply circuit may include: a p-type conductive element having a control terminal and providing a switchable conductive path between the first voltage supply and the supply line, and a logic gate having an output connected to said control terminal, a first input connected to receive a control signal to enable precharge with said control signal in a first state and a second input connected to receive a signal to disable precharge with said control signal in the first state in effecting a voltage boost operation.

According to a third aspect of the present invention there is provided a method of boosting a gate voltage of an insulated gate transistor, said method comprising the steps of: resetting a voltage to a predetermined level on a supply line connected to said transistor; precharging the supply line to a first voltage by connecting to the supply line a voltage supply of said first voltage and a boost precharge circuit; and boosting the supply line to a second voltage higher than said first voltage by connectng a capacitive element between said voltage supply and the precharged supply line.

According to a fourth aspect of the present invention there is provided a method of boosting a gate voltage for insulated gate transistors in a memory array comprising an array of insulated gate transistors, said method comprising the steps of: resetting a voltage to a predetermined level on a supply line connected to said transistors; precharging the supply line to a first voltage by connecting to the supply line a voltage supply of said first voltage and a boost precharge circuit; and boosting the supply line to a second voltage higher than said first voltage by connecting a capacitive element between said voltage supply and the precharged supply line.

The step of precharging to a first voltage may comprise connecting the supply line to a first voltage through a conductive path of an n-type switch circuit and through a conductive path of a p-type switch circuit, each conductive path being provided by one of the voltage supply circuit and the boost precharge circuit.

For a better understanding of the present invention and to show how the same may be carried into effect, reference will now be made by way of example to FIGS. 1 to 8 of the accompanying drawings.

BRIEF DESCRIPTION OF THE DRAWINGS

FIG. 3 illustrates in tabular form the signals applied to various cells within the flash memory array during operation;

DESCRIPTION OF THE PREFERRED EMBODIMENT

Figure 1:
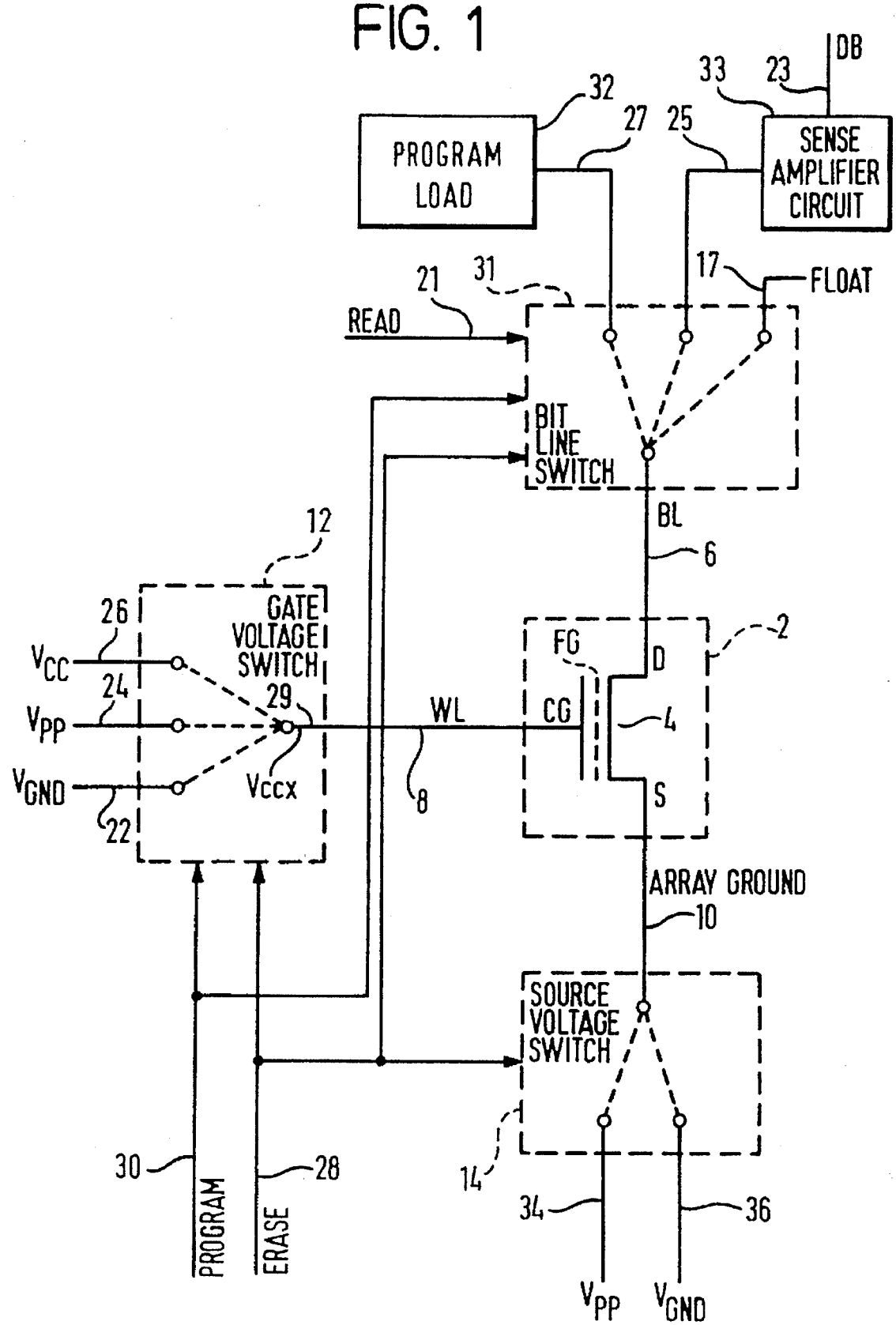
FIG. 1 is an illustrative example of a basic flash memory cell showing the different signal levels which can be applied to the cell.

FIG. 1 illustrates a flash memory cell 2 comprising a single floating gate transistor 4 having a control gate CG, a floating gate FG, a source S, and a drain D. The source S of the floating gate transistor 4 is connected to an ARRAY GROUND signal on line 10. Through a source voltage switch circuit 14 this line 10 can be at a ground voltage VGND or a high voltage Vpp. Voltage Vpp represents a programming potential (typically 12V) and voltage VGND represents device ground. Vpp is normally connected to array ground, either directly or via a resistor (not shown). The source voltage switch 14 is connected to the voltage Vpp via line 34 and the voltage VGND via line 36. The control gate CG of the floating gate transistor 4 is connected to the output voltage Vccx on line 29 of a gate voltage switch 12 by a word line (WL) 8. The gate voltage switch 12 is further connected to voltages Vcc, Vpp and VGND on lines 26, 24 and 22 respectively. Vcc is at 5V for a 5V part or 3V for a 3V part. These switches 14 and 12 each receive a control signal ERASE on line 28 and additionally the gate voltage switch 12 receives a control signal PROGRAM on line 30. The drain D of the floating gate transistor 4 is connected to a bit line switch, 31 by a bit line (BL) 6. The bit line switch is further connected to the output of a program load 32 on write line 27, the input of a sense amplifier circuit 29 on read line 25, and a floating connection FLOAT on line 17. It will be appreciated that in an array a plurality b of selected bit lines may simultaneously be connected to the sense amplifier circuit 29 during a read operation so that line 25 will be normally implemented as b lines. Similarly, during a program operation a plurality b of selected bit lines may simultaneously be connected to the program load 32, so that line 27 will also normally be implemented as b lines. In the described embodiment b=8. The switch 31 receives a control signal READ on line 21 in addition to the control signals PROGRAM and ERASE on lines 30 and 28 respectively.

The flash memory has three primary modes of operation: program, erase and read. Each of these modes will be described hereinafter with reference to FIG. 1. It will be understood by a person skilled in the art that several other modes of operation, such as program verify for example, also exist. However, the present description is by way of background illustration only, and therefore only these three modes will be described. The program mode involves writing a "0" to a memory cell or group of memory cells, the erase mode involves removing a "0" from any cell that has a "0" stored in it such that the cells all effectively store "1"s, and the read mode involves reading a cell to establish whether it is programmed or erased, i.e. contains either a "0" or a "1".

During a program mode, the control signal PROGRAM on line 30 is set such that the gate voltage switch 12 is configured to connect the voltage Vpp on line 24 to the control gate CG of transistor 4 via word line 8. As the control signal ERASE on line 28 is not set the source voltage switch 14 is configured to connect the voltage VGND on line 36 to the source of transistor 4 via the ARRAY GROUND signal line 10. The bit line switch 31 is set such that the bit line on line 6 is connected to the program load 32 by line 27. The program load is such that a voltage of between 4 and 8V is on the drain D of the transistor 4 via the bit line 6. As a result of these signals applied to the transistor 4 the floating gate FG becomes negatively charged. The negative charge increases the threshold voltage of the floating gate transistor making it less conductive. The amount of negative charge accumulated at the floating gate depends on several factors, including the duration for which the control signal PROGRAM is set, the voltages applied to the gate and drain terminals, and the thickness of the oxide separating the floating gate from the channel of the transistor. Furthermore, as the cell is programmed the accumulation of negative charge on the floating gate causes the electric field across the field oxide to reduce such that a point is reached where no more negative charge is attracted to the floating gate such that the threshold voltage of the floating gate transistor saturates to a limit. In this way, a "0" is written into the cell. Normally, several program pulses may be needed, each pulse being followed by a verify cycle.

During an erase mode, the control signal ERASE on line 28 is set such that the gate voltage switch 12 is configured to connect the voltage VGND on line 22 to the control gate CG of the transistor 4 via the word line 8, and such that the switch 14 is configured to connect the voltage Vpp on line 34 to the source S of the transistor 4 via the ARRAY GROUND line 10. The bit line switch 31 is set such that the bit line 6 is connected to the floating connection FLOAT on line 17 so that it floats. As the floating gate transistor is fabricated such that the source region in the substrate underlies the floating gate, any negative charge on the floating gate will be reduced. The amount of negative charge removed from the floating gate FG depends on the various factors as discussed above with reference to the program operation. The reduction of negative charge reduces the threshold voltage of the floating gate transistor making it more conductive. In this way the state of the cell is restored to "1". Normally, several erase pulses may be required, each erase pulse being followed by a verify cycle.

During a read mode, neither the control signal ERASE on line 28 nor the control signal PROGRAM on line 30 are set but the READ signal on line 21 is set. The Vcc signal on line 26 is connected by the source voltage switch 12 to the control gate of the transistor 4 via the line Vccx and the word line 8. If the device is a 3V part, the supply voltage Vcc is disconnected from the signal Vccx, and hence the wordline WL 8, is boosted above Vcc by means not shown. The voltage VGND on line 36 is connected to the source of the transistor 4 via the ARRAY GROUND signal line 10. The bit line 6 is biased to approximately 1 volt during a read operation by a bit line load within the sense amplifying circuit. During a read operation, for an erased cell (with "1" stored in it) the conductivity of the cell is such that current passes through the cell when the bit line is connected for sensing. For a programmed cell (with a "0" stored in it) substantially no current is passed by the cell. The current passed (or not) by the cell is compared with a reference current to detect the status of the cell.

The operation of a flash cell in a memory array will now be described with reference to FIG. 2. Signal lines or circuitry common to FIG. 1 can be identified in FIG. 2 by use of the same reference numerals. Voltage supplies have not all been illustrated in FIG. 2 for reasons of clarity, but it will be understood with reference to FIG. 1 which voltages are required in various parts of the circuit.

Figure 2:
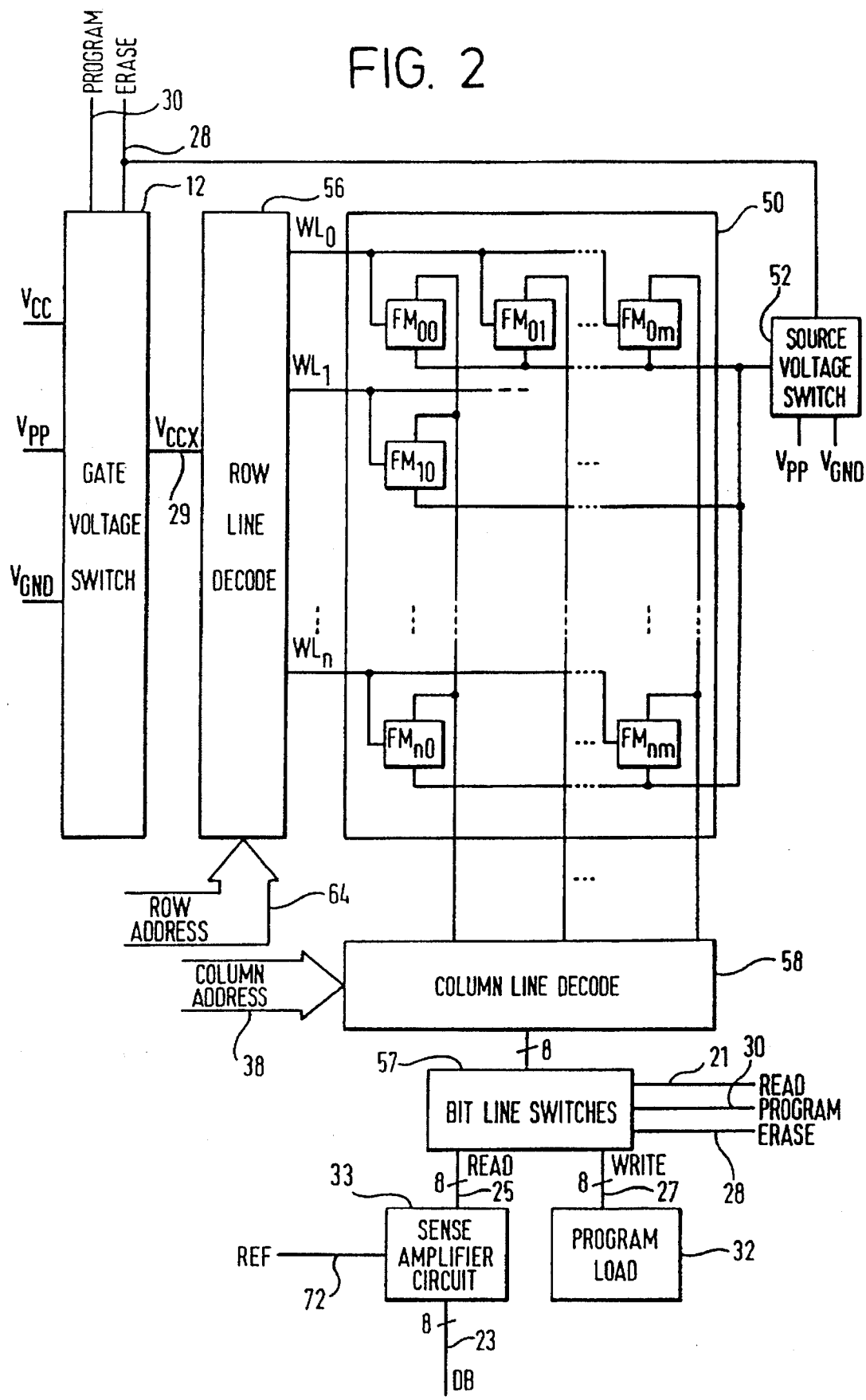
FIG. 2 is an illustrative block diagram of the overall structure of a flash memory array.

FIG. 2 illustrates a flash memory array 50 comprising a plurality of flash memory cells FMoo ... FMnm, arranged in rows and columns, each of which can be the same as the cell 2 shown in FIG. 1. The gates of the transistors in each memory cell in a row are commonly connected to a respective word line WLo ... WLn addressable by a row line decode circuit 56 which receives the row address 64. The gate voltage switch 12 responds to the control signals PROGRAM and ERASE on line 30 and 28 respectively, and supplies the appropriate gate voltage Vccx on line 29 to be switched to the addressed wordline through the row decode circuit 56.

The drains of each transistor in a column are commonly connected by bit lines BLo ... BLm to a column line decode circuit 58. The column line decode circuit selects a plurality b (in this example, b=8) of the bit lines BLo to BLm to be connected to a plurality b of bit line switches 31 shown in FIG. 2 as a block of bit line switches 57. Therefore eight of the m bit lines BLo ... BLm are selected by the column address 38 to be connected to the eight bit line switch circuits. The outputs of the bit line switches 57 on line 25 is a read output and is connected to the sense amplifier circuit 29. The sense amplifier circuit 29 contains a plurality of sense amplifiers (eight in the described embodiment to allow eight bits to be read in a common cycle), and hence the output on line 25 is actually a plurality of bits wide (eight in the described example). The bit line switches receive a write input on line 27 from the program load 32. During a program operation eight of the bit lines BLo to BLm are selectively connected to the program load 32. The program load 32 similarly comprises a plurality (in this example eight) of program loads, and hence the input on line 27 is actually also eight bits wide. During a read operation the selected bit line (or bit lines) are connected to the sense amplifier circuit 29. The sense amplifier circuit 29 also receives a reference signal REF on line 72 and generates output signals on the data bus (DB) 23, which is an eight bit bus in the described embodiment. The respective output signals are generated by comparing the signals on the respective bitlines with the reference signal REF.

It will be appreciated that when a particular cell is chosen to be programmed, the program load will only be applied to a selected column so that other cells in the same row as the selected cell are not inadvertently programmed. Unselected columns are clamped to ground to avoid coupling from neighbouring selected bit lines. The signals existing on the various modes of cells in an array for various operations are summarised in FIG. 3. During an erase operation every cell in the memory array is erased, although it will be appreciated by a person skilled in the art that an array could be split into sectors for erasing so that only part of the array is erased at any one time. During an erase operation the bitlines are allowed to float to reduce stress across the source/drain terminals since the sources are taken to a very high voltage.

A memory device which is compatible with both 3V and 5V supplies will require some means for determining which supply is being used. The boost circuitry described hereinafter will only be enabled when the supply is 3V. The device can be configured to match the available supply by means of a user input or by means of a detection circuit on the device which generates an appropriate signal on detection of a 3V or a 5V supply.

Figure 4:
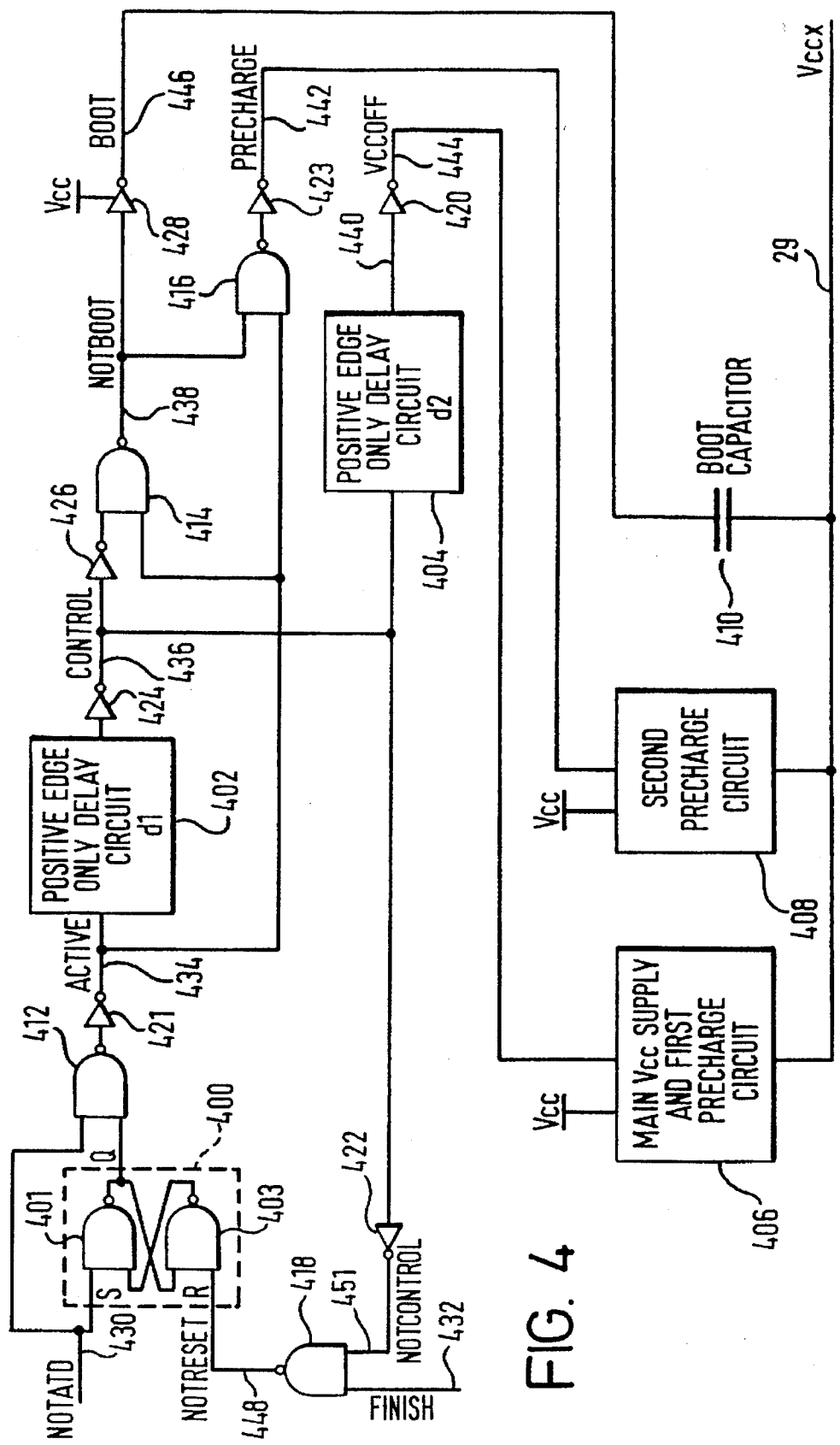
FIG. 4 is a block schematic of a boost scheme according to the present invention.

FIG. 4 illustrates diagrammatically a circuit (which may be used with the memory described hereinabove with reference to FIGS. 1 to 3) for providing the boosted voltage for the wordline for a device having only a low supply voltage. The circuitry includes a flip-flop 400 having a set-input S, a reset input R, and an output Q, the Q output being responsive to low going pulses on the set input S or the reset input R. The circuitry further includes two positive edge only delay circuits 402 and 404, each having an input and an output and having independent delays d1 and d2 respectively, a main Vcc supply and first precharge circuit 406, a second precharge circuit 408, a boot capacitor 410, four two-input NAND gates 412 to 418, and a plurality of inverters 420..428.

The flip-flop 400 receives at its set input S a signal NOTATD on line 430 which is the output signal from the address transition detection circuitry which indicates that transition has occurred to the address of a cell in the array. As is well known, the address transition detection circuitry detects a transition on the address lines by generating a low going pulse on the signal NOTATD or a transition on the chip enable input by releasing the signal NOTATD from a low state. The reset input R of the flip-flop 400 receives a signal NOTRESET on line 448. The NAND gate 412 receives as one of its inputs the signal NOTATD on line 430 and as its other input the signal on the output Q of the flip-flop 400. The NAND gate 412 generates an output signal ACTIVE on line 434 via the inverter 421. The positive edge only delay circuit 402 receives as its input the signal ACTIVE on line 434. The inverter 424 receives as its input the output of the positive edge only delay d1 circuit 402 and generates a signal CONTROL on its output on line 436. The inverter 426 receives as its input the signal CONTROL on line 436. The NAND gate 414 receives as one of its inputs the output of the inverter 426, and as the other of its inputs the signal ACTIVE on line 434. The output of the NAND gate 414 forms a signal NOTBOOT on line 438. The inverter 428 receives as its input the signal NOTBOOT on line 438 and generates at its output the signal BOOT on line 446. The inverter 428 selectively supplies the supply voltage Vcc to the signal BOOT in dependence on the state of the signal NOTBOOT. The NAND gate 416 receives as one of its inputs the signal NOTBOOT on line 438 and as the other of its inputs the signal ACTIVE on line 434. The NAND gate 416 generates at its output the signal PRECHARGE on line 442 via the inverter 423. The inverter 422 receives as its input the signal CONTROL on line 436 and generates a signal NOTCONTROL on line 451. The NAND gate 418 receives as one of its inputs a signal FINISH on line 432 and as the other of its inputs the signal NOTCONTROL on line 451. The output of the NAND gate 418 forms the signal NOTRESET on line 448. The positive edge only delay d2 circuit 404 recieves at its input the signal CONTROL on line 436, and the inverter 420 receives as its input the ouput of the positive edge only delay d2 circuit 404 and generates a signal VCCOFF at its output on line 444.

The main Vcc supply and first precharge circuit 406 receives the supply voltage Vcc and the signal VCCOFF on line 444 and is also connected to the signal Vccx on line 29. During a read cycle the supply voltage Vcc is selectively connected to the signal Vccx by the main Vcc supply and first precharge circuit under control of the signal VCCOFF. The second precharge circuit 408 receives the supply voltage Vcc and the signal PRECHARGE on line 442 and is also connected to the signal Vccx on line 29. The supply voltage Vcc is selectively connected to the signal Vccx by the second precharge circuit under control of the signal PRECHARGE. The boot capacitor 410 has one terminal connected to the signal BOOT on line 446, and its other terminal connected to the signal Vccx on line 29.

The operation of the circuitry of FIG. 4 in boosting the signal Vccx will now be described with additional reference to the timing diagrams of FIGS. 5a to 5j.

The signal on the output of the address transition detection circuitry is a negative going pulse. This signal goes low on detection of an address transition and remains low for a fixed period determined by the address transition detection circuitry. Should any further address transistions be detected then the output of the address transition circuitry will remain low until the address lines or other lines monitored by the address transition detection circuitry have stabilised. A positive going edge of the signal NOTATD on line 430 starts the boost cycle.

The flip-flop 400 is a set-reset flip-flop responsive to low going pulses. That is to say, the output Q of the flip-flop changes state in response to low going pulses on one of its inputs S or R. A low going pulse on the set input S sets the output Q high, and the output Q remains in this state until a low going pulse on the reset input R resets the output Q low. In the event of simultaneous low going pulses on the set input S and the reset input R, Q will be forced high. The flip-flop 400 comprises two NAND gates 401 and 403. The NAND gate 401 receives as one input the signal NOTATD on line 430 via the set input S of the flip-flop 400, and as its other input the output of the NAND gate 403. The output of the NAND gate 401 forms the Q output of the flip-flop 400. The NAND gate 403 receives as one input the signal NOTRESET via the reset input R of the flip-flop 400, and as its other input the output of the NAND gate 401.

In response to a transition on an address line, the signal NOTATD on line 430 transitions from high to low as represented by edge 800 of FIG. 5(a). In response to this negative transition of the signal NOTATD the output Q of the flip-flop 400 is set high. However, the signal ACTIVE on line 434 remains low due to the action of the NAND gate 412 and the inverter 421. After detection of an address transition, the signal NOTATD is held low for a fixed period d2 determined by a delay in the address transition detection circuitry, and then goes high, as represented by edge 802 of FIG. 5(a). In response to the signal NOTATD going high, the signal ACTIVE goes high as shown by edge 804 of FIG. 5(b). The signal ACTIVE going high represents the start of a boost cycle.

In an asynchronous environment, the address transition detection circuitry may detect an address transition after a time when a read operation (and hence a boost operation) has already been initiated. In such a case the current read cycle must be aborted and a new one started. A more detailed explanation of such operation will be given later. However, when such further address transition detection occurs, it is necessary for a reset to be performed before a further read or boost cycle can be performed. The duration of the reset is the delay d2 of the address transition detection circuitry. Such a reset is important to ensure that the wordline supply Vccx has returned to a known voltage level at the start of the boost operation. If a reset is not performed then the wordline supply may be further boosted. If the selected wordline was consequently further boosted, then a programmed cell (the floating gate transistor associated therewith having a relatively high threshold voltage) may unnecessarily turn on and conduct current. Furthermore, boosting to an unnecessarily high voltage wastes power and would increase the time required to reset the wordline supply to the power supply. The period for which such a reset operation needs to be carried out is dependent upon how fast the wordline supply can be returned to the required known voltage, which will be dependent upon the capacitance of the wordline supply and the reset circuit. The circuitry used to reset the wordline supply is the same as that used to boost the wordline supply. Therefore, on detection of an address transition, the negative going pulse of the signal NOTATD has a width d2 determined by the length of the reset period required. It is stressed that the wordline supply is boosted from a well defined level (Vcc) and to a well defined level, dependent on the relative size of the boost capacitor and the capacitance of the wordline supply.

The signal ACTIVE determines whether a read or boost cycle is active or not; when the signal ACTIVE is high a read or boost cycle is in progress. Forcing the signal ACTIVE low therefore resets a boost cycle. As can be understood from the arrangement of the NAND gate 412 and inverter 421, the signal ACTIVE is held low when the signal NOTATD is low. Therefore, the negative going pulse of the NOTATD signal can be conveniently used as a reset signal, and the address transition detection circuitry is configured such that on detection of an address transition the NOTATD signal is held low for the period d2 equal to the period required to reset the wordline supply to the required known level. The signal ACTIVE going high terminates the reset period.

Figure 5:
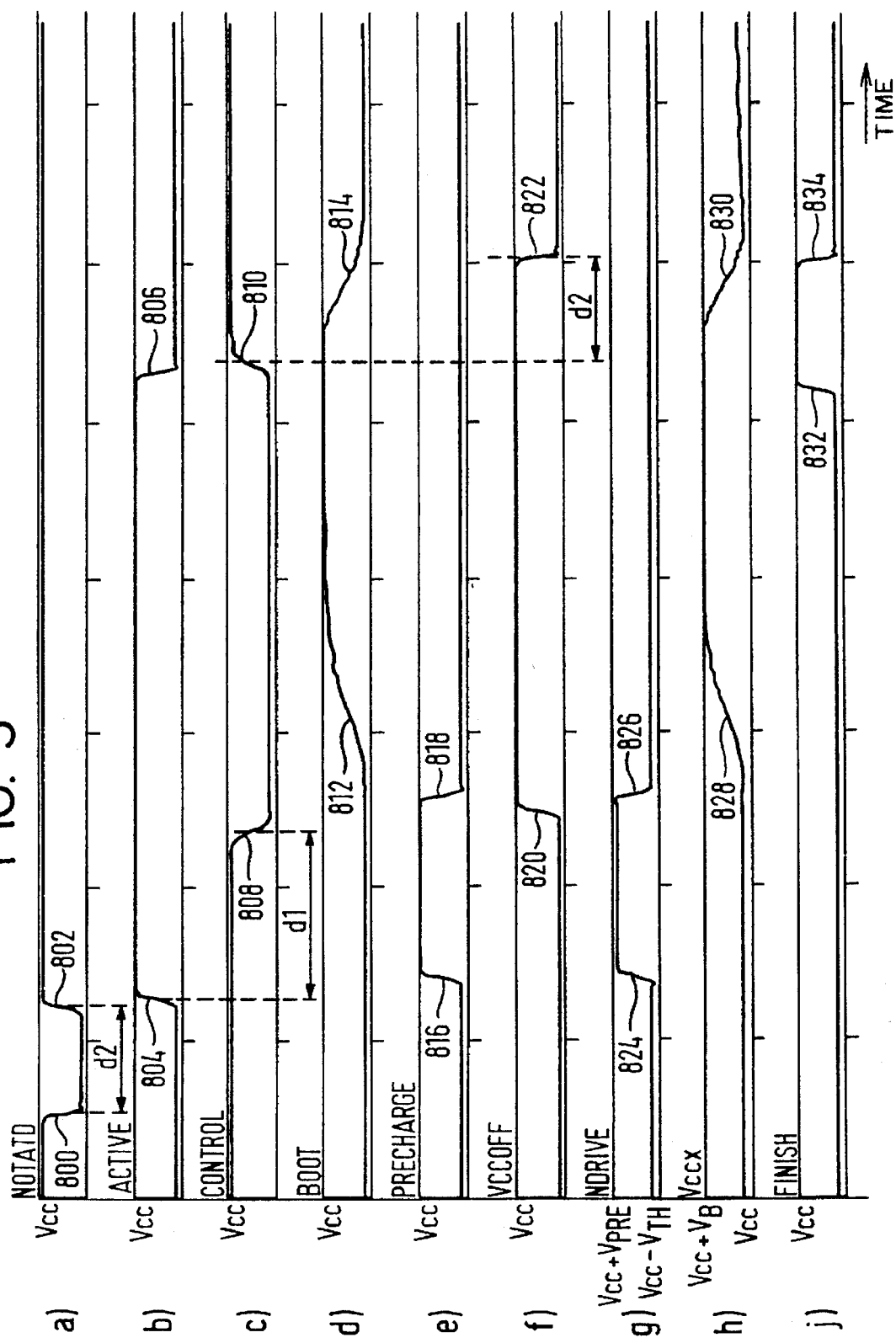
FIGS. 5(a)–5(j) illustrate one example of the timing sequences for the signals shown in the schematic of FIG. 4.

As can be seen from the timing diagrams of FIG. 5, prior to the negative going pulse of the signal NOTATD the signal ACTIVE was low and hence in this example the previous read cycle had completed, and was therefore not aborted by the new NOTATD pulse. In response to the signal ACTIVE going high as represented by edge 804, the precharge period starts and the signal PRECHARGE on line 442 goes high as represented by edge 816 of FIG. 5(e). The second precharge circuit 408 therefore becomes active and starts precharging the wordline signal level Vccx to the supply voltage Vcc.

It should also be noted that upto this time the signal VCCOFF on line 444 has been low, and therefore the main Vcc supply and first precharge circuit 406 has been active supplying the supply voltage Vcc to the wordline signal level Vccx. The main Vcc supply and first precharge circuit therefore has clamped the wordline supply Vccx to the supply voltage Vcc. The main Vcc supply and first precharge circuit 406 is only inactive during the time that the wordline supply Vccx is to be boosted above the supply voltage Vcc, and is otherwise active. Between an aborted cycle and a new cycle the main Vcc supply and first precharge circuit 406 is activated for the same time as the second precharge circuit 408 and hence acts as a source of precharge to Vccx during this time.

Referring to FIG. 5(c), a fixed time d1 after the signal ACTIVE on line 804 goes high, the signal CONTROL on line 808 goes low. The delay d1 is determined by the positive edge only delay d1 circuit 402. In response to the edge 808 of the signal CONTROL, the signals PRECHARGE and VCCOFF change state as represented by edges 818 and 820 respectively. Hence it can be seen that the delay d1 of the positive edge only delay d1 circuit 402 determines the precharge time of the boost cycle. The signals PRECHARGE and VCCOFF changing state will disable the second precharge circuit 408 and the main Vcc supply and first precharge circuit 406 respectively such that the line 29 carrying the signal Vccx becomes high impedance. This then terminates the precharge period of the cycle.

Furthermore, in response to the signal CONTROL on line 436 going low on edge 808, the signal NOTBOOT on line 438 becomes active by going low. Hence the signal BOOT on line 446 will start to rise towards Vcc as fast as possible. This is the start of the boost phase of the cycle. As can be seen by the edge 812 of the signal BOOT in FIG. 5(d), the rise of the signal BOOT is slowed by charging the heavy capacitive node BOOT. The speed of the edge 812 will be determined by the size of the drive inverter 428 and the size of the boot capacitor 410. The size of the boot capacitor 410 is determined by the amount of capacitance on the wordline supply connected to the signal Vccx. Our co-pending patent application number (PWF Ref No.76750) details a divided wordline architecture which may be advantageously applied in combination with the present invention to reduce the total capacitance to be boosted and hence to increase the speed at which the boot capacitor 410 is charged up and hence to speed up the total cycle time, and the contents of such are herein incorporated by reference.

In response to the rising edge 812 of the signal BOOT, the wordline signal level Vccx rises from the level of the supply voltage Vcc to a fixed voltage $V_B$ above the supply voltage Vcc as illustrated by the edge 828 of Vccx, as a result of the coupling action of the boot capacitor 410. Once the wordline has been boosted the sensing operation can be initiated.

In the example illustrated with reference to FIG. 5, some time after the wordline signal level Vccx has been boosted a positive going pulse on the signal FINISH, represented by edges 832 and 834 of FIG. 5(j), indicates the end of the sense operation so that the wordline signal level Vccx can now return to its quiescent level. The origin and generation of the signal FINISH will be discussed in detail later. In response to the high going edge 832 of the positive going pulse on the signal FINISH as illustrated in FIG. 5(j), a negative going pulse on the signal NOTRESET on line 448 resets the flip-flop 400 and the Q output goes low and hence the signal ACTIVE goes low. In response to the signal ACTIVE going low as represented by edge 806 of FIG. 5(b) the signal CONTROL goes high as shown by edge 810 of FIG. 5(c). Consequently the signal NOTBOOT goes high and the signal BOOT goes low as represented by edge 814. The signal BOOT going low couples the wordline signal level Vccx back to near the supply voltage, as shown by edge 830 of FIG. 5(h). Thus ending the boost phase of the cycle.

Referring to FIG. 5(f), it can be seen that the signal VCCOFF remains high during the time that the signal Vccx returns to the supply voltage Vcc. The time at which the signal VCCOFF changes state in response to the signal CONTROL going high is determined by the positive edge delay d2 circuit 404. This delay is fixed to be the reset period d2, ie the time required for the wordline signal level Vccx to return to the known voltage level of the supply voltage Vcc. After the delay time d2 the signal VCCOFF goes low and the main Vcc supply and first precharge circuit 406 beomes active to provide the supply voltage Vcc to the wordline Vccx. By keeping the signal VCCOFF high during this reset period it is ensured that the main Vcc supply and first precharge circuit 406 remains off during this reset period. Hence the signal line 29 carrying the signal level Vccx is high impedance during this reset.

The positive going edge of the positive going pulse on the signal FINISH successfully terminates the read cycle. On the negative going edge of the FINISH pulse the circuit of FIG. 4 returns to its initial state. The means for driving the signal FINISH low will be described in detail hereinafter.

Figure 6:
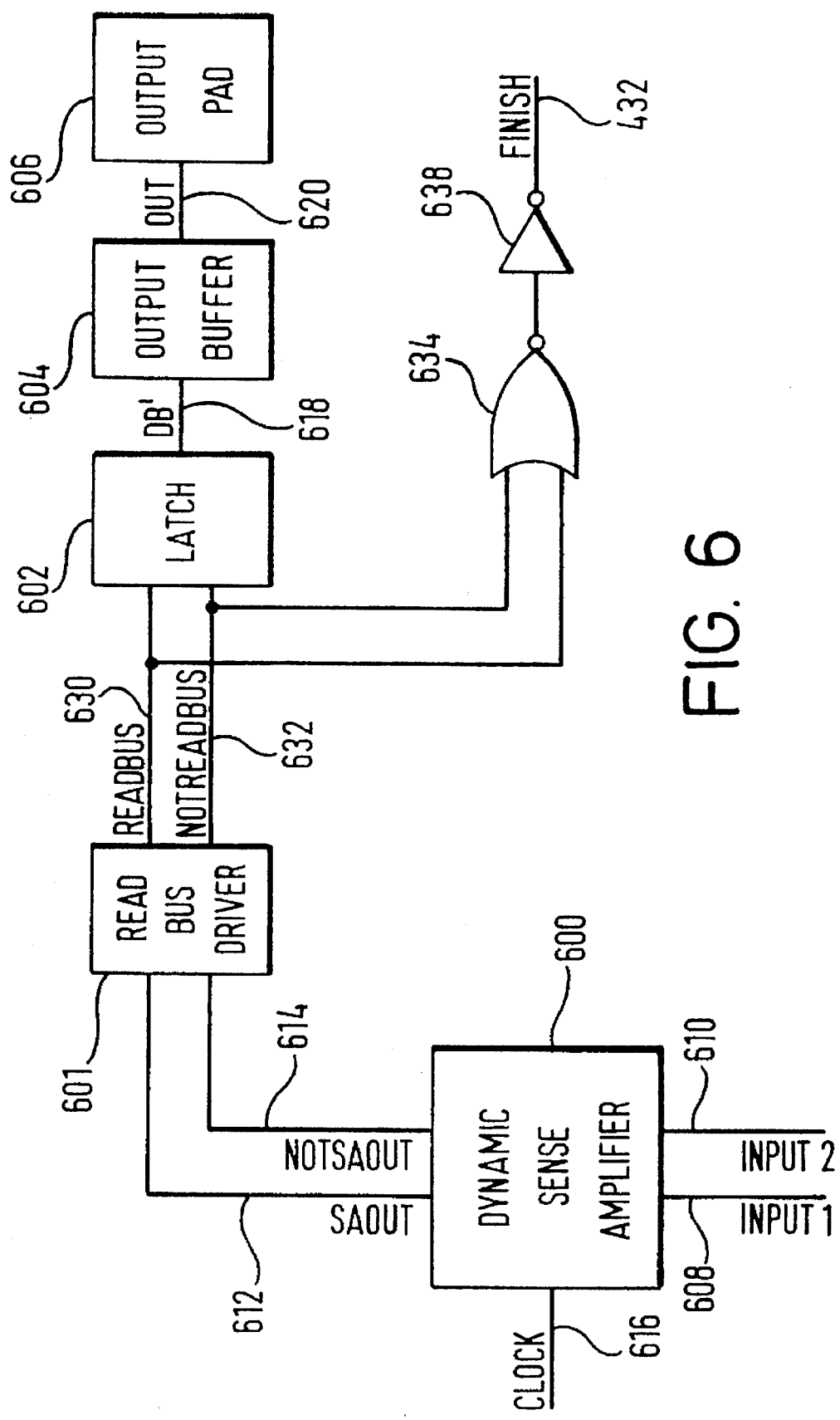
FIG. 6 is a block schematic of a dynamic sense amplifier with which the present invention may be utilised.

The boost scheme according to the present example also has particular advantages when used in a memory device which uses at least one dynamic sense amplifier, and in particular in relation to generation of the signal FINISH. Dynamic sence amplifiers take many forms, but work on the common principle of developing a small differential signal on two input lines, this small differential signal being developed into full complementary CMOS signals on the output of the dynamic sense amplifier. Referring to FIG. 6, there is shown an illustrative block diagram of a dynamic sense amplifier and associated circuitry such as may be used in a memory device.

A dynamic sense amplifier 600 receives a differential input signal on lines 608 and 610 represented by signals INPUT1 and INPUT2 respectively. The differential signal may be a current or voltage differential signal. As is well known to a person skilled in the art, once the differential signal is developed on the inputs to the dynamic sense amplifier, the amplifier is clocked or latched and a regenerative feedback action occurs within the sense amplifier such that latched full complementary signals appear as signals SAOUT and NOTSAOUT on lines 612 and 614 respectively. The signal which clocks the dynamic sense amplifier 600 is represented by a signal CLOCK on line 616. The outputs SAOUT and NOTSAOUT on lines 612 and 614 respectively form the inputs to a read bus driver 601.

The read bus driver 601 generates complementary outputs READBUS and NOTREADBUS on signal lines 630 and 632 respectively. The signals READBUS and NOTREADBUS on lines 630 and 632 form inputs to a latch 602. The output of the latch 602 is a data output bit DB' on line 618 which forms an input to an output buffer 604. The data output bit DB' is one bit of the eight bit data bus DB. The output of the output buffer 604 is a signal OUT on line 620 which is presented on an output pad 606.

Once the differential signal has been established on the inputs to the dynamic sense amplifier and the dynamic sense amplifier has been clocked such that the outputs of the dynamic sense amplifier having started to move towards a stable state due to the regenerative feedback action of the dynamic sense amplifier, the differential signals on the inputs to the dynamic sense amplifier can return to their default state because the outputs of the amplifier are latched in a stable state. Hence, once the dynamic sense amplifier has been clocked such that the data to be read has been latched on its ouput the boosted signal can be removed from the wordline of the selected memory cell.

The signals READBUS and NOTREADBUS on lines 630 and 632 also form the inputs to a two input NOR gate 634, which generates the signal FINISH on output line 432 via an inverter 638. Prior to a read cycle the signals READBUS and NOTREADBUS are precharged to zero volts by means not shown, but well understood by a person skilled in the art. When the dynamic sense amplifier 600 is clocked by the signal CLOCK on line 616, the data on the outputs SAOUT and NOTSAOUT is propogated onto the signals READBUS and NOTREADBUS such that one of them will change from zero volts to a logical high state. Hence the output of the NOR gate 634 will change from high to low and consequently the signal FINISH will change from low to high. Hence the signal FINISH which ends the boost cycle is generated once the dynamic sense amplifier has settled into its stable state having driven its data onto the signals READBUS and NOTREADBUS. Alternatively, the signal FINISH could be derived directly from the signal CLOCK which clocks the dynamic sense amplifer 600. However, such a scheme would not be as advantageous as detecting a signal on the outputs of the read bus driver 601 if the dynamic sense amplifier was slow to settle and the logic path back to the flip-flop was fast, such that the cycle was terminated before the sense amplifier settled. In this case the output would be invalid.

In any event, it can be seen that the scheme of the present example allows for the boost cycle to be ended asynchronously immediately a stable data value has been latched by the dynamic sense amplifier. Therefore, as soon as the data value has established the boost circuit can be reset ready for another read or boost cycle. Such an asynchronous operation for ending a boost cycle is advantageous since it means that no timer circuit is required for ending the boost cycle a fixed time after the start of the boost cycle.

If a signal to start a read cycle, ie a negative going pulse on the signal NOTATD, and a signal to finish a read cycle, ie a positive going pulse on the signal FINISH, occur simultaneously then the signal to start the read cycle must take precedence over the signal to finish the read cycle. Such a precedence is achieved by applying the signal FINISH to the reset input R of the flip-flop 400 via the NAND gate 418. The negative going pulse on the signal NOTATD will force the signal CONTROL high such that the signal NOTCONTROL on the other input of the NAND gate 418 will be low, such that the output of the NAND gate 418 is forced high regardless of the signal FINISH. With the signal NOTATD low, the Q output of the flip-flop 400 will be high. After being set high, the signal CONTROL will remain high for a length of time determined by the delay d1 of the positive edge only delay d1 circuit. Therefore by the time the signal CONTROL returns low the signal FINISH will have returned low. In the example described above for generating the FINISH signal the signals READBUS and NOTREADBUS would return to their default state in this time such that the signal FINISH would return low. The circuit of FIG. 4 will therefore now be guaranteed to be in a start of cycle state, and the new read cycle will commence normally. It can therefore be understood that a signal to finish a read cycle will only have an effect on the circuit of FIG. 4 after the signal CONTROL has gone low.

The signal CONTROL takes control of the read cycle; the read cycle is only allowed to finish if the signal CONTROL is low, since if the signal CONTROL is high either the read cycle has already finished or else the signal to finish the read cycle has occured too near the beginning of a new cycle.

Referring to FIG. 4, during an actual boost operation with the signal CONTROL being low, a low to high transition on the signal FINISH will cause a high to low transition on the signal NOTRESET and therefore reset the output Q of the flip-flop to a logic low, and hence the signal ACTIVE is also reset low to terminate the boost phase. Conversely, with the flip-flop 400 set with its output Q high, a negative leading edge of a new NOTATD pulse will also cause the signal ACTIVE to go low and end the current boost phase. It can therefore be seen that the read cycle can be ended in response to a FINISH signal (ie a normal end of cycle) or aborted in response to a new address transition.

If a new address transition is detected after a pulse on the FINISH signal has reset the flip-flop 400, the negative transition of the pulse on the signal NOTATD will set the flip-flop 400 and a boost cycle will commence as described above with reference to FIGS. 4 and 5. Similarly, as has been described hereinabove, if a pulse occurs on the signal FINISH during the reset period of the boost cycle it will have no effect on the boost cycle.

It will be noted that there is an inherent propagation delay between the signal NOTATD going low and the signal NOTCONTROL going low, caused by the circuitry comprising the NAND gate 412, the inverter 421, the positive edge only delay circuit 402, the inverter 424 and the inverter 422. It is therefore possible that a positive edge transition on the signal FINISH could cause a high to low transition on the signal NOTRESET if such occurs during this propagation delay time before NOTCONTROL goes low. However, at this instant the set input S of the flip-flop is held low by the pulse NOTATD. It is a property of the flip-flop 400 that its Q ouput is high when both its set input S and its reset input R are low, and therefore this high to low transition on the signal NOTRESET does not reset the flip-flop 400. After a short period equal to the above-mentioned propagation delay the signal NOTCONTROL goes low, and the signal NOTRESET returns high.

Figure 7:
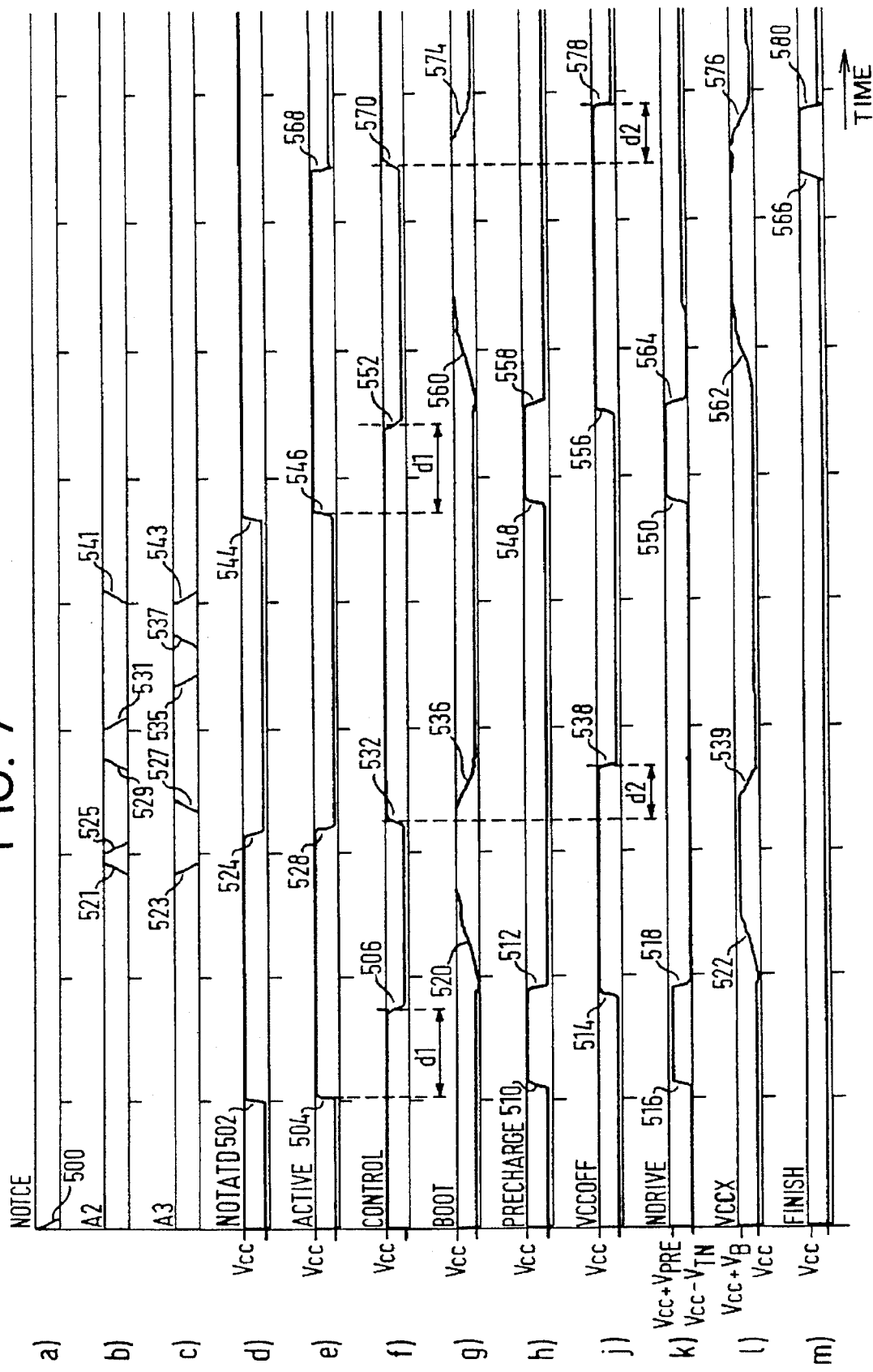
FIGS. 7(a)–7(m) illustrate a second example of the timing sequences for the signals shown in the schematic of FIG. 4.

With reference to the timing diagrams of FIG. 7, the operation of the boost circuit of FIG. 4 will now be further described, starting with a chip enable cycle and explaining the operation of the circuit when an address transition causes a read cycle to be aborted. In addition to showing the timing relationship of the signals of FIG. 4, FIG. 7 also shows the signals on two address lines A2 (FIG. 7(b)) and A3 (FIG. 7(c)) and the signal transitions on a chip enable signal NOTCE (FIG. 7(a)).

When the memory device is not selected or enabled, the signal NOTATD on line 430 is held low by a chip enable buffer, and all the other signals of the circuit of FIG. 4 are in their default states such that the reset signal NOTRESET on line 448 is high.

In response to a chip enable signal NOTCE going from high to low the device, of which the circuitry of FIG. 4 forms a part, becomes enabled. A fixed time after the device is enabled, as represented by the edge 500 of the chip enable signal NOTCE illustrated in FIG. 7(a), the signal NOTATD goes high as represented by edge 502. As the Q output of the flip-flop 400 is high, the signal NOTATD going high causes the signal ACTIVE to go high as represented by edge 504 of FIG. 7(e), and hence a boost cycle commences as described previously with reference to FIG. 5. In response to the signal ACTIVE going high the signal PRECHARGE goes high as illustrated by edge 510 of FIG. 7(h), and consequently the second precharge circuit 408 turns on to precharge the signal Vccx to Vcc. At this time the main Vcc supply and first precharge circuit is already clamping the signal Vccx to Vcc since the signal VCCOFF is low as shown by FIG. 7(j). After the precharge time d1 determined by the positive edge only delay d1 circuit 402 the signal PRECHARGE goes low as represented by edge 512 of FIG. 7(h) and the signal VCCOFF goes high as represented by edge 514 of FIG. 7(j), both in response to the signal CONTROL going low as represented by edge 506 of FIG. 5(f). Also in response to the negative edge 506 of the signal CONTROL the signal NOTBOOT goes low, and hence the signal BOOT rises towards Vcc as represented by edge 520 of FIG. 7(g), and consequently the signal Vccx rises towards a signal level of Vcc+$V_B$ as described above with reference to FIG. 5.

Some time after the signal Vccx has been boosted to a level of Vcc+$V_B$, address transitions on the lines A2 and A3 are detected and the signal NOTATD goes low as represented by the edge 524 of FIG. 7(d). As a result of the negative edge 524 of the signal NOTATD, the signal ACTIVE goes low as illustrated by edge 528 of FIG. 7(e) and the signal CONTROL goes high as illustrated by the edge 532 of FIG. 7(f) and hence a reset period is entered. As has been described hereinabove with reference to FIG. 5 the signal VCCOFF remains high for the reset period d2 under the control of the positive edge only delay d2 circuit 404 after the signals ACTIVE and CONTROL go low. Furthermore, in response to the signal ACTIVE going low the signal BOOT on line 446 returns to a low level and the signal Vccx returns to a level of approximately Vcc, as represented by edges 536 and 539 respectively. At the end of the reset period d2 the signal VCCOFF goes low as illustrated by edge 538 and the main Vcc supply and first precharge circuit 406 starts supplying Vcc to the signal Vccx. At the end of the reset period d2, however, the signal NOTATD remains low since transitions are still occurring on the address lines A2 and A3. A succession of transitions are detected by the address transition detection circuit on the address signals A2 and A3 such that the signal NOTATD remains low for a long period. The address transition detection circuitry will not generate the trailing edge of the address transition pulse until the inputs being monitored have been stable for a fixed time. Consequently, some time after the start of the pulse on the signal NOTATD represented by falling edge 524, rising edge 544 indicates the end of the address transition detection pulse, propagated as edge 546 in the signal ACTIVE, and the circuit of FIG. 4 is released to enter a boost cycle.

In response to the rising edge 546 of the signal ACTIVE on line 434, the signal PRECHARGE on line 442 goes high as represented by edge 548 and hence the second precharge circuit 408 assists the main Vcc supply and first precharge circuit 406 in precharging the signal Vccx to the supply voltage Vcc. From this point onwards the circuit of FIG. 4 operates in the same way as was described hereinabove with reference to the timing diagrams of FIG. 5.

The signal CONTROL on line 436 goes low on edge 552 in response to the positive edge 546 propogated through the positive edge only delay d1 circuit 402. As a consequence of the signal CONTROL on line 436 going low on edge 552 the signal NOTBOOT on line 438 goes low and the signal VCCOFF on line 444 goes high as shown by the edge 556. The signal PRECHARGE on line 442 goes low on edge 558 in response to the signal NOTBOOT going low. As a consequence both the second precharge circuit 408 and the main Vcc supply and first precharge circuit 406 are disabled and the signal Vccx on line 29 becomes tristate. The signal BOOT on line 446 then starts to rise to the supply voltage Vcc as represented by edge 560, and consequently the signal Vccx will rise to a voltage $V_B$ above the supply voltage Vcc as represented by the edge 562. As before described, the signal Vccx will then remain in the boosted state until a further address transition pulse or until the signal FINISH on line 432 goes high. The timing sequence of the signal FINISH is shown in FIG. 7(m).

As shown by edge 566 of FIG. 7(m), at some point in time whilst the signal Vccx is boosted the signal FINISH transitions from low to high under external control as has been described hereinabove in relation to FIGS. 4 and 5. At the point when the signal FINISH transitions to a high level on edge 566, the signal NOTCONTROL on line 451 (which is the inverse of the signal CONTROL) is in a high state, and hence the signal NOTRESET on line 448 will transition from high to low in response to the transition from low to high of the signal FINISH, and hence the output Q of the flip-flop 400 will be reset low, and 4ence the signal ACTIVE will be forced low as shown by edge 568.

In response to the negative edge 568 of the signal ACTIVE the signal CONTROL goes high as illustrated by the positive edge 570, and further consequently the signal NOTBOOT goes high. As a consequence of the signal NOTBOOT going high the signal BOOT on line 446 goes low as illustrated by negative edge 574 and consequently the signal Vccx goes towards the supply voltage Vcc as illustrated by negative edge 576. A fixed period d2 (determined by the delay of the positive edge only delay d2 circuit 404) after the positive edge 570 of the signal CONTROL the reset period is terminated by a negative edge 578 of the signal VCCOFF, and hence the signal Vccx is precharged to the supply voltage Vcc. The FINISH signal on line 432 goes low as shown by edge 580 because the READBUS and NOTREADBUS signals are precharged low by means not shown but under the control of the circuit of FIG. 4.

As can be understood from the foregoing description with reference to FIGS. 4, 5 and 7 the boost scheme provided by the present invention has three distinct phases namely reset, precharge and boost. As will now be understood the reset phase causes the signal Vccx to be reset to a level of approximately the supply voltage. It is important to boost from a well-defined level in order to boost to a well-defined level, and the reset and precharge operations are important to this condition. It is important that with successive boost operations that neither 'walk-down' occurs (since cell currents may become too small for sensing) or 'walk-up' occurs, since this is unnecessary and may stress devices attached to the boosted node. The size of the fixed voltage $V_B$ above which the signal Vccx is boosted is dependent upon the characteristics of the boot capacitor 410. Hence the reset and precharge phases ensure that the signal Vccx is always returned to a known level.

The precharge phase precharges the signal Vccx to the supply voltage Vcc. In the preferred embodiment discussed with reference to FIG. 4 it can be seen that precharge is provided by two circuits: the main Vcc supply and first precharge circuit 406 and the second precharge circuit 408. In known memory systems, precharge is only supplied by a single precharge circuit separate to the circuit providing the main Vcc supply. The circuit supplying the main Vcc supply cannot generally be used for providing precharge because of the physical size of the devices it requires. Such a circuit requires large p-type transistors because of the need to provide Vcc from a low impedance supply. The circuit supplying the main Vcc supply cannot generally be used for providing precharge because the switching speed of such circuits is inherently slow. A precharge circuit .to be used in a boost scheme such as that provided by the present example needs to be able to switch on and off quickly to minimise the length of the precharge period. Hence a separate precharge circuit capable of fast switching is conventionally provided, typically comprising of p-type transistors.

However, according to the present example a circuit for supplying the main Vcc supply has been provided which is capable of switching rapidly and can therefore also be used to provide precharge during a boost cycle. As the circuit for supplying the main Vcc supply is conventionally comprised of p-type transistors such a circuit will provide p-type precharge.

It is also advantageous to have precharge provided by both p-type transistors and n-type transistors. Therefore, in the presence of process skews (weak p-type devices and strong n-type devices or vice versa), the two sources of precharge are complimentary thereby improving precharge characteristics. Hence in the preferred embodiment of the present invention the main Vcc supply and first precharge circuit 406 provides precharge through p-type devices and the second precharge circuit 408 provides precharge through n-type devices. As will be described in detail with the preferred implementation of the second precharge circuit 408 given with reference hereinafter to FIG. 8, it is necessary to provide a further boosted voltage to a precharge circuit comprising n-type devices during a precharge operation.

At the end of the precharge phase the signal Vccx becomes tristate, and is then boosted to a voltage above the supply voltage Vcc.

Figure 8:
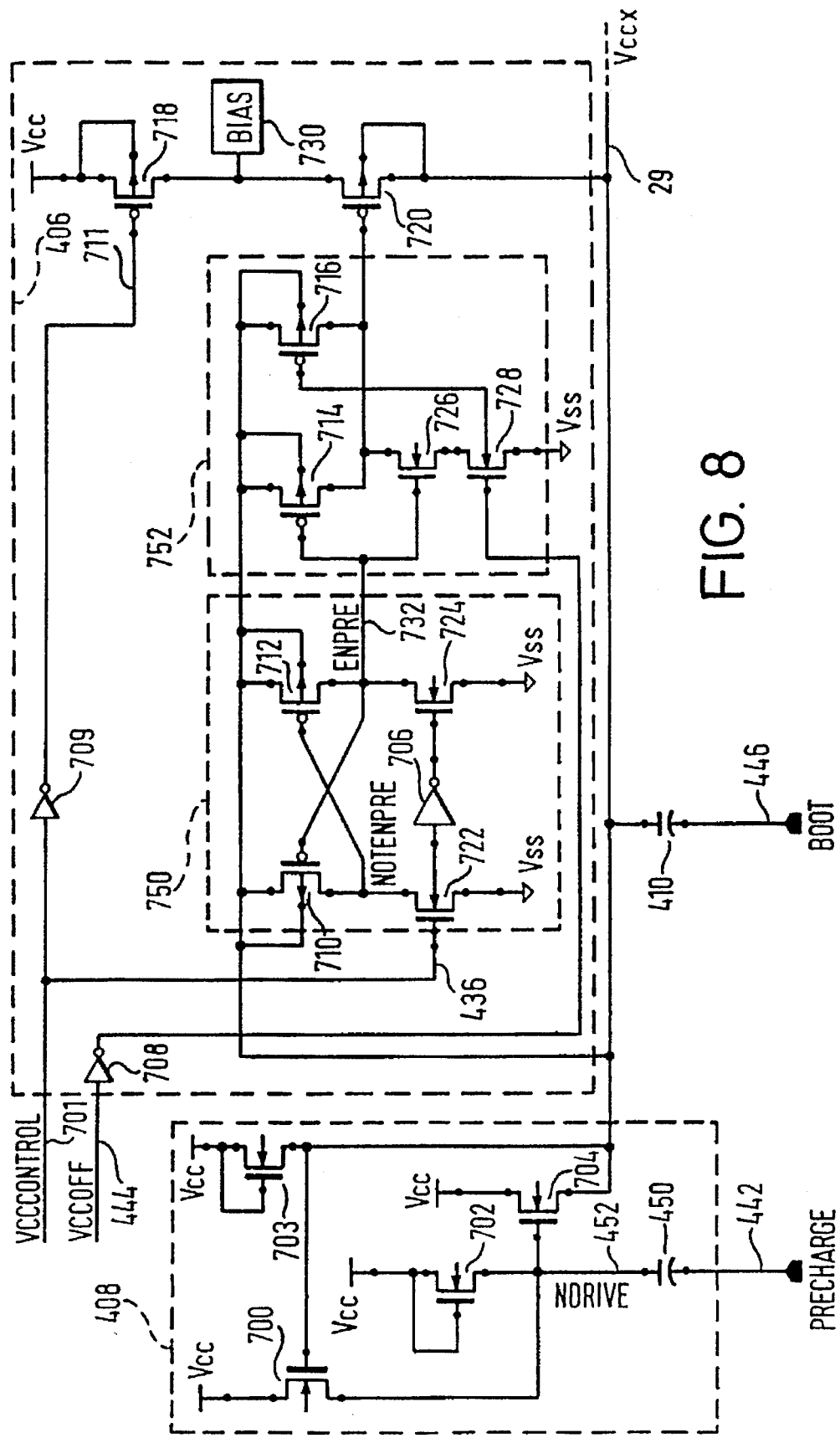
FIG. 8 illustrates an implementation of part of the schematic of FIG. 4 using known circuit components.

The operation of the second precharge circuit 408 and the main Vcc supply and first precharge circuit 406 of FIG. 4 will now be described with reference to FIG. 8, which illustrates a preferred embodiment of such circuits.

The second precharge circuit 408 comprises a capacitor 450 and four n-channel transistors 700, 702, 703 and 704. The capacitor 450 has one terminal connected to the signal PRECHARGE on line 442, and another terminal to a line 452 which forms a signal NDRIVE. The transistor 700 has its gate connected to the signal Vccx on line 29, its drain connected to the supply voltage Vcc, and its source connected to the signal NDRIVE on line 452. The transistor 702 has both its gate and its drain connected to the supply voltage Vcc, and its source connected to the signal NDRIVE on line 452. The transistor 704 has its drain connected to the supply voltage Vcc, its gate connected to the signal NDRIVE on line 452, and its source connected to the signal Vccx on line 29. The transistor 703 has both its gate and its drain connected to the supply voltage Vcc, and its source connected to the signal Vccx.

The main Vcc supply and first precharge circuit 406 comprises an elevator circuit 750 consisting of an inverter 706, two p-channel transistors 710 and 712 and two n-channel transistors 722 to 724; a NAND gate 752 comprising two p-channel transistors 714, 716 and two n-channel transistors 726 and 728; in addition to two inverters 708, 709, two p-channel and a bias circuit 730. P-channel transistor 710 has its source connected to the signal Vccx on line 29, its well connected to its source, its gate connected to a signal ENPRE on line 732, and its drain connected to the drain of the n-channel transistor 722. The transistor 722 has its source connected to the negative supply voltage or ground Vss and its gate connected to a signal VCCCONTROL on line 701. The p-channel transistor 712 has its source connected to the signal Vccx on line 26, its well connected to its source, its gate connected to the drain of the n-channel transistor 722, and its drain connected to the signal ENPRE on line 732. The n-channel transistor 724 has its drain connected to the signal ENPRE on line 732, its source connected to the negative supply voltage or ground Vss, and its gate connected to the inverse of the signal VCCCONTROL on line 701 via the inverter 706. The p-channel transistor 714 has its source connected to signal Vccx on line 29, its well connected to its source, its gate connected to the signal ENPRE on line 732, and its drain connected to the drain of the n-channel transistor 726. The n-channel transistor 726 further has its gate connected to the signal ENPRE on line 732 and its source connected to the drain of the n-channel transistor 728. The n-channel transistor 728 further has its gate connected to the inverse of the signal VCCOFF on line 444 via the inverter 708, and its source connected to the negative supply voltage or ground Vss. The p-channel transistor 716 has its source connected to the signal Vccx on line 29, its well connected to its source, its gate connected to the inverse of the signal VCCOFF on line 444 via the inverter 708, and its drain connected to the common drain connection of the transistors 714 and 726. The p-channel transistor 718 has its source connected to the supply voltage Vcc, its gate connected to the inverse of the signal VCCCONTROL on line 701 via the inverter 709, and its drain connected to the drain of the p-channel transistor 720. The p-channel transistor 720 has its gate connected to the common drains of transistors 714 and 726 and its source connected to the signal Vccx on line 29. The bias circuit 730 is connected to the common drains of the transistors 718 and 720.

The operation of the circuitry of FIG. 8 will now be described with additional reference to FIG. 5. During power-up of the memory device, the transistor 702 serves to bias the signal NDRIVE 452 at a voltage equal to the supply voltage Vcc less the threshold voltage $V_{TN}$ of the transistor 702. Therefore, as the supply voltage Vcc rises from zero to its final value, the signal NDRIVE rises from zero such that its instantaneous value is $V_{cc}-V_{TN}$. Similarly, the diode connected transistor 703 serves to bias the signal Vccx to $V_{cc}-V_{TN}$. Hence during power-up the transistor 702 holds the signal NDRIVE at $V_{cc}-V_{TN}$, and transistor 703 pulls Vccx up to $V_{cc}-V_{TN}$. Otherwise during power-up the level of Vccx could not be guaranteed. The voltage level on Vccx guaranteed by the operation of the second precharge circuit 408, ensures there is sufficient voltage to power any logic circuits required to be powered by Vccx during power-up, for example wordline drivers. Once power-up has been achieved, the main Vcc supply and first precharge circuit 406 ensures the signal Vccx is at Vcc, and therefore the transistor 700 ensures that the signal NDRIVE on line 452 is maintained at a voltage of $V_{cc}-V_{TN}$. When a boost operation is not occuring, the signal PRECHARGE on line 442 is equal to zero volts.

In order for the second precharge circuit 408, which comprises n-channel transistors, to be able to precharge the signal Vccx to Vcc, the signal NDRIVE on line 452 must be taken well above the level of Vcc, and this is achieved by the use of the capacitor 450. As has been previously described with reference to FIGS. 4, 5 and 7, during a precharge cycle the signal PRECHARGE on line 442 will go high. The signal PRECHARGE going high will cause the signal level at the node NDRIVE to rise due to the coupling action of the capacitor 450. Hence to ensure that the node NDRIVE is driven well above Vcc the transistor 700 is used to hold NDRIVE at a default level of $V_{cc}-V_{TN}$ once power-up has been completed. It can therefore be seen, referring to FIGS. 5(g) and 7(k), that when the signal PRECHARGE is high the signal NDRIVE is driven to a voltage $V_{PRE}$ above Vcc. This therefore ensures that a voltage level of Vcc is supplied to the signal Vccx through the n-channel transistor 704 during a precharge phase.

As has been mentioned earlier, the main Vcc supply and first precharge circuit 406 has two roles. Its primary role is to provide the supply voltage Vcc to the wordline via the signal Vccx, and its secondary role is to precharge the signal Vccx to Vcc during the precharge phase of a boost cycle for devices which have a low supply voltage. It should therefore be apparent that in devices which have a supply voltage Vcc of 5V the secondary function of the main Vcc supply and first precharge circuit is never utilised. Hence, during normal operation of the main Vcc supply and first precharge circuit 406, the circuit merely operates to provide the supply voltage Vcc to the wordline via the signal Vccx, by means of the p-channel transistors 718 and 720. Hence during read cycles the signal VCCCONTROL is normally high such that the p-channel transistor 718 is normally on. Similarly, the signal VCCOFF is normally low. When the signal VCCOFF is low, the transistor 728 is on, and the transistor 716 is off. The signal VCCCONTROL ensures that the transistor 722 is on and the transistor 724 is off. Hence the transistor 712 is on such that the signal level on Vccx appears as the signal ENPRE. Assuming that Vccx is at a high signal level (either as a result of the action of the second precharge circuit 408 or the main Vcc supply and first precharge circuit 406), the signal ENPRE will be high. The signal ENPRE is inverted by the NAND gate effectively formed by the transistors 714, 716, 726 and 728 such that the signal on the gate of the p-channel transistor 720 is low and hence the transistor 720 is on. In this way the signals VCCCONTROL and VCCOFF ensure that the signal Vccx is precharged to Vcc through the transistors 718 and 720.

During a boost operation, the supply of Vcc to the signal line Vccx through the p-channel transistors 718 and 720 must be turned off, or else the boost operation may be degraded by the current path to Vcc through the transistors. As has previously been described with reference to FIGS. 4, 5 and 7, when the boost operation starts the signal VCCOFF goes high, and hence the transistor 716 turns on and the transistor 728 turns off.

The transistor 716 ensures that the gate of the transistor 720 is connected to the signal line Vccx, which immediately prior to the boost will be Vcc. Hence the transistor 720 turns off and the line Vccx becomes tristate. As the voltage level on the line Vccx rises above Vcc the voltage level on the gage of transistor 720 will follow it. It is essential that the gate of the transistor 720 is taken to the boosted voltage level. If the gate of the transistor 720 was merely held at Vcc, while its drain was connected to the boosted voltage on Vccx, the transistor 720 would not be fully turned off and there would be a path from Vcc to Vccx which would degrade the boost operation.

During the boost operation, the second precharge circuit 408 has no effect on the signal level on Vccx since all the transistors that are connected to the wordline via Vccx in the precharge circuit are n-channel.

Referring again to the main Vcc supply and first precharge circuit 406, it would be possible to control the turn-off of the p-channel transistor 720 without the transistors 714, 716, 726 and 728 of the NAND gate 752 by connecting the signal NOTENPRE directly to the gate of the p-channel transistor 720, and deriving the signal on line 436 from a logical combination of the signals VCCCONTROL and VCCOFF. However, such an arrangement would not switch very quickly and is therefore not desirable because the duration of the precharge period would not be minimised. The elevator circuit 750 does not switch very quickly because the n-channel transistors 722 and 724 must turn on or off before the dc levels are established on the output nodes ENPRE and NOTENPRE, and feedback action via the cross-couple arrangement takes place before the p-channel devices turn on or off, unlike a normal CMOS switching device where the n-channel devices and the p-channel devices switch simultaneously. If the device 720 cannot be turned on and off quickly, then the main Vcc supply and first precharge circuit 406 cannot be used also as a precharge circuit during aborted read cycles.

To ensure fast switching and therefore enable the main Vcc supply and first precharge circuit 406 to function as a precharge circuit, the transistors 714, 716, 726 and 728, forming the NAND gate 752, have been added to the conventional elevator control of the main Vcc supply circuit. This arrangement acts as a buffer so that the transistors 710, 712, 722, 724 and the inverter 706 can be made much smaller. The VCCOFF signal is then directly gated into the NAND arrangement in order to obtain the necessary fast switching speed. It can be seen that the switching of the p-channel transistor is now controlled by the NAND gate 752, and in turn the switching of the NAND gate during a read cycle is controlled only by the signal VCCOFF (the signal VCCCONTROL and hence the signal ENPRE remaining in the same state during a boost cycle). The inverse of the signal VCCOFF switches both the n-channel device 728 and the p-channel device 716 of the NAND gate simultaneously, thus providing the necessary fast switching.

The CMOS input from the inverse of the signal VCCOFF to the NAND gate is acceptable because the voltage on the gate of p-channel transistor 716 is only high when either the signal Vccx is equal to Vcc as in a read cycle, or when Vccx is driven by some other source, e.g. a 12V supply for a program operation. In this case the signal VCCCONTROL is low and hence the signal ENPRE is low, and therefore the p-channel transistor 714 is on ensuring the gate of the p-channel transistor 720 is high. For this reason it is acceptable to have a CMOS input to the NAND gate with a variable level supply (ie Vccx) as in this instance.

What is claimed is:

1. Voltage boost circuit for supplying a gate voltage to an insulated gate transistor, said circuit comprising:

a voltage supply circuit of a first voltage;

a supply line for connection to the gate of the insulated gate transistor and connected to said voltage supply circuit for precharge to the first voltage by said voltage supply circuit;

boost circuitry including a boost precharge circuit connected to said supply line for precharging said supply line to the first voltage, and a capacitive element connected to said supply line to boost the voltage on said supply line to a second voltage higher than said first voltage after precharge;

reset circuitry for resetting the voltage on said supply line to said first voltage after operation of said boost circuitry; and control circuitry for controlling operation of said reset circuitry and said boost circuitry.

2. The voltage boost circuit of claim 1, wherein said voltage supply circuit and said boost precharge circuit are connected to precharge the supply line together in effecting a voltage boost operation.

3. The voltage boost circuit of claim 1 or claim 2, wherein one of said voltage supply circuit and said boost precharge circuit connects said supply line to the first voltage through a conductive path of an n-type switch circuit, and the other through a conductive path of a p-type switch circuit.

4. The voltage boost circuit of claim 1, wherein said supply line is connected to the control gate of a floating gate transistor.

5. The voltage boost circuit of claim 4 in combination with a flash EPROM memory device, wherein said supply line is connected to the control gates of a plurality of floating gate transistors forming a row of the flash EPROM memory device.

6. The voltage boost circuit of claim 1, further comprising voltage detection circuitry arranged to control operation of said boost circuitry in dependence on the value of the first voltage.

7. The voltage boost circuit of claim 1, wherein said voltage supply circuit includes:

a p-type conductive element having a control terminal and providing a switchable conductive path between the first voltage supply and the supply line, and a logic gate having an output connected to said control terminal, a first input connected to receive a control signal to enable precharge with said control signal in a first state and a second input connected to receive a signal to disable precharge with said control signal in the first state in effecting a voltage boost operation.

8. A memory comprising an array of insulated gate transistors, including a voltage boost circuit for supplying a gate voltage to said transistors, said boost circuit comprising:

a voltage supply circuit of a first voltage;

a supply line for connection to the gates of the plurality of insulated gate transistors and connected to said voltage supply circuit for precharge to the first voltage by said voltage supply circuit;

boost circuitry including a boost precharge circuit connected to said supply line for precharging said supply line to the first voltage, and a capacitive element connected to said supply line to boost the voltage on said supply line to a second voltage higher than said first voltage after precharge;

reset circuitry for resetting the voltage on said supply line to said first voltage after operation of said boost circuitry; and control circuitry for controlling operation of said reset circuitry and said boost circuitry.

9. The memory of claim 8, wherein said array is a flash EPROM memory device.

10. The memory of claim 8 or claim 9, wherein said memory array further comprises:

bit lines, a sense amplifier having first and second input terminals for connection respectively to a selected bit line and a reference signal and first and second outputs, said sense amplifier also including latch circuitry for providing stable logic states for said outputs in dependence on the state of the differential between a signal on said selected bit line and said reference signal; and detection circuitry responsive to said first and second outputs to control the reset circuitry to reset the voltage on the supply line.

11. The memory of claim 10, wherein said sense amplifier is a dynamic sense amplifier.

12. The memory of claim 10, wherein the first and second outputs provide complimentary logic states.

13. A method of boosting a gate voltage of an insulated gate transistor, said method comprising the steps of:

precharging a supply line connected to said transistor to a first voltage by connecting to the supply line a voltage supply of said first voltage and a boost precharge circuit, wherein during the step of precharging the supply line, a capacitive element connected to the supply line is charged to the first voltage;

boosting the supply line to a second voltage higher than said first voltage by connecting the capacitive element between the precharged supply line and said voltage supply; and resetting the voltage on the supply line to said first voltage.

14. A method of boosting a gate voltage for insulated gate transistors in a memory array comprising an array of insulated gate transistors, said method comprising the steps of:

precharging a supply line connected to said insulated gate transistors to a first voltage by connecting to the supply line a voltage supply of said first voltage and a boost precharge circuit, wherein during the step of precharging the supply line, a capacitive element connected to the supply line is charged to the first voltage;

boosting the supply line to a second voltage higher than said first voltage by connecting the capacitive element between the precharged supply line and said voltage supply; and resetting the voltage on the supply line to said first voltage.

15. The method of claim 13 or claim 14, wherein said supply line is connected to the control gate of a floating gate transistor.

16. The method of claim 13 or claim 14 in combination with a flash EPROM memory, wherein said supply line is connected to the control gates of a plurality of floating gate transistors forming a row of a flash EPROM memory device.

17. The method of claim 13 or 14, wherein said boost operation is effected by a single shot boost.

18. A method of boosting a gate voltage of an insulated gate transistor, said method comprising the steps of:

precharging a supply line connected to said insulated gate transistor to a first voltage by connecting to the supply line a voltage supply of said first voltage and a boost precharge circuit, said precharging comprising connecting the supply line to a first voltage through a conductive path of an n-type switch circuit and through a conductive path of a p-type switch circuit, wherein during the step of precharging the supply line, a capacitive element connected to the supply line is charged to the first voltage;

boosting the supply line to a second voltage higher than said first voltage by connecting the capacitive element between the precharged supply line and said voltage supply; and resetting the voltage on the supply line to said first voltage.

19. A method of boosting a gate voltage of an insulated gate transistor, said method comprising the steps of:

precharging a supply line connected to said insulated gate transistor to a first voltage by connecting to the supply line a voltage supply of said first voltage and a boost precharge circuit, wherein during the step of precharging the supply line, a capacitive element connected to the supply line is charged to the first voltage;

boosting the supply line to a second voltage higher than said first voltage by connecting the capacitive element between the precharged supply line and said voltage supply, said boosting being enabled depending on the value of the first voltage; and resetting the voltage on the supply line to said first voltage.

20. A method of boosting a gate voltage for insulated gate transistors in a memory array comprising an array of insulated gate transistors, said method comprising the steps of:

precharging a supply line connected to said insulated gate transistors to a first voltage by connecting to the supply line a voltage supply of said first voltage and a boost precharge circuit, said precharging comprising connecting the supply line to a first voltage through a conductive path of an n-type switch circuit and through a conductive path of a p-type switch circuit, wherein during the step of precharging the supply line, a capacitive element connected to the supply line is charged to the first voltage;

boosting the supply line to a second voltage higher than said first voltage by connecting the capacitive element between the precharged supply line and said voltage supply; and resetting the voltage on the supply line to said first voltage.

21. A method of boosting a gate voltage for insulated gate transistors in a memory array comprising an array of insulated gate transistors, said method comprising the steps of:

precharging a supply line connected to said insulated gate transistors to a first voltage by connecting to the supply line a voltage supply of said first voltage and a boost precharge circuit, wherein during the step of precharging the supply line, a capacitive element connected to the supply line is charged to the first voltage;

boosting the supply line to a second voltage higher than said first voltage by connecting the capacitive element between the precharged supply line and said voltage supply said boosting being enabled depending on the value of the first voltage; and resetting the voltage on the supply line to said first voltage.

22. A voltage boost circuit for supplying a gate voltage to an insulated gate transistor, said circuit comprising:

a voltage supply circuit of a first voltage;

a supply line for connection to the gate of the insulated gate transistor and connected to said voltage supply circuit for precharge to the first voltage by said voltage supply circuit;

means for precharging said supply line to the first voltage;

means, connected to said supply line, for boosting the voltage on said supply line to a second voltage higher than said first voltage after precharge;

reset circuitry for resetting the voltage on said supply line to said first voltage after operation of said boosting means.

23. The voltage boost circuit of claim 22, further comprising control circuitry for controlling operation of said reset circuitry, said precharging means and said boosting means.

24. The voltage boost circuit of claim 23, wherein said precharging means comprises a boost precharge circuit connected to the supply line.

25. The voltage boost circuit of claim 24, wherein said boosting means comprises a capacitive element.

26. The voltage boost circuit of claim 25, wherein said voltage supply circuit and said boost precharge circuit are connected to precharge the supply line together in effecting a voltage boost operation.

27. The voltage boost circuit of claim 24, wherein one of said voltage supply circuit and said boost precharge circuit connects said supply line to the first voltage through a conductive path of an n-type switch circuit, and the other of said voltage supply circuit and said boost precharge circuit connects said supply line to the first voltage through a conductive path of a p-type switch circuit.

28. The voltage boost circuit of claim 22, wherein said supply line is connected to a control gate of a floating gate transistor.

29. The voltage boost circuitry of claim 22, further comprising a flash EEPROM memory device, wherein said supply line is connected to control gates of a plurality of floating gate transistors forming a row of the flash EEPROM memory device.

* * * * *